United States Patent [19]

Gloaguen

[11] Patent Number: 5,606,281
[45] Date of Patent: Feb. 25, 1997

[54] POWER AMPLIFIER STAGE OF THE VOLTAGE FOLLOWER TYPE

[75] Inventor: Gilbert Gloaguen, Tourville/Odon, France

[73] Assignee: U.S. Philips Corporation, New York, N.Y.

[21] Appl. No.: 504,816

[22] Filed: Jul. 20, 1995

[30] Foreign Application Priority Data

Aug. 25, 1994 [FR] France .................................. 94 10277

[51] Int. Cl.⁶ ............................... H03F 3/185; H03F 3/30
[52] U.S. Cl. ........................... 330/51; 327/108; 330/255; 330/269
[58] Field of Search ........................... 330/51, 255, 264, 330/269; 327/108, 112, 387, 563

[56] References Cited

U.S. PATENT DOCUMENTS 4,480,230  10/1984  Brehmer et al. ........................ 330/255
4,988,954  1/1991   Stern et al. .
5,121,011  1/1992   Ohya et al. ............................. 307/570
5,349,243  9/1994   McClure ................................. 327/108
5,481,213  1/1996   Johnson ............................. 330/255 X

FOREIGN PATENT DOCUMENTS

0492374  7/1992  European Pat. Off. .

Primary Examiner—James B. Mullins
Attorney, Agent, or Firm—Arthur G. Schaier

[57] ABSTRACT

The amplifier stage comprises at the output two MOS power transistors in series between a positive supply line and earth, the gate of each of these being controlled by a respective amplifier. An input signal is applied to the input of these amplifiers so as to be compared with an output signal of the amplifier stage. The amplifiers are each provided with an inhibiting input with which it is possible to connect to earth the gate of the corresponding power transistor, and the amplifier stage comprises two transistors which act as switches achieving that either the one or the other of the inhibiting inputs is connected to earth, so that a simultaneous conduction of the power transistors is excluded.

7 Claims, 4 Drawing Sheets

POWER AMPLIFIER STAGE OF THE VOLTAGE FOLLOWER TYPE

BACKGROUND OF THE INVENTION

1. Field of the Invention

The invention relates to a power amplifier stage of the voltage follower type which receives an input voltage signal and supplies an output signal, which stage comprises at the output a first MOS power transistor whose source is coupled to a common mode line in series with a second MOS power transistor whose drain is coupled to a positive supply line, which two transistors are of the same conductivity type and whose common junction point supplies said output signal of the stage, which stage further comprises a first amplifier supplying a first control signal applied to the gate of the first MOS power transistor, and a second amplifier supplying a second control signal applied to the gate of the second MOS power transistor, which first and second amplifier each receive the input signal at a respective first input, with which signal the output signal of the stage, applied to a respective second input, is compared.

2. Description of the Related Art

A power amplifier stage with a voltage gain equal to 1 is known from the document EP-A-0 492 374, whose envisaged application is the reproduction of acoustic signals.

MOS power transistors are also quite suitable for forming the output of the power amplifier stage in an application specifically designed for motor control, because of their robustness in the presence of an inductive charge. However, this type of transistor has a high gate capacitance, currently of the order of about a hundred pF, so that the control of these transistors renders it necessary to use an amplifier capable of charging and discharging this gate capacitance in a time span compatible with the desired specifications.

It is equally desirable for this same application that the conductive state of the MOS output transistors should be controlled in a very emphatic manner, i.e. the resistance to current passage should be as low as possible, for example Ron below 1 Ohm.

Under these circumstances, a rigorous time management of the conductive and blocked states of these two power transistors must be ensured so as to avoid a risk of destruction of these transistors, which would be the case if the two power transistors were conductive simultaneously even for a short moment.

Finally, a power amplifier stage of the voltage follower type should also comply with a current consumption requirement, which must be as low as possible when the stage is idle, i.e. when the input voltage is equal to the output voltage of the stage. By contrast, major currents must be possible at the output for transitory states during which the amplifier is out of balance, in response to input/output imbalance voltages as small as 100 or 200 mV, and with a response time which should comply with the requirements of the application.

The known amplifier stage complies only partly with these requirements since it has been specially designed for avoiding crossover distortion and not for minimizing the idle current consumption. In the known amplifier stage, in fact, the capability of reacting rapidly at the output in response to a variation in the input voltage is directly connected to the value of the idle current. This idle current, accordingly, cannot be chosen to be as low as desired.

SUMMARY OF THE INVENTION

It is thus one of the aims of the invention to provide a perfected power amplifier stage which to a large extent eliminates the drawbacks of the known circuit with a view to its application to a motor supply.

According to the present invention, in order to exclude a simultaneous conduction of the two MOS power transistors, each of the amplifiers is provided with an inhibiting input and is arranged so as to supply a gate control signal equal to the common mode voltage when said inhibiting input is brought to this same common mode voltage, and in that the stage comprises two switching transistors of the MOS field effect type each having its source coupled to the common mode line, a first switching transistor having its gate coupled to the gate of the first MOS power transistor and its drain connected to the inhibiting input of the second amplifier, and a second switching transistor whose gate receives a signal derived from the gate voltage of the second MOS power transistor and whose drain is connected to the inhibiting input of the first amplifier.

Thus, when one or the other of the two MOS power transistors is in a highly conducting state, the other transistor will be blocked by the effect of one of the switching transistors. The possibility of the power transistors being destroyed through simultaneous conduction, even during a short, transitory period, is thus avoided. The amplifier stage according to the invention is capable of ensuring at its output a very precise following of the voltage of the input signal when this voltage does not vary or varies slightly.

When on the other hand the input signal varies rapidly, involving a switching of the state of the MOS power transistors, this switching, controlled by the switching transistors, is realized while ensuring a delay in entering of the conductive state of one of the MOS power transistors equal to the switching-off time of the other transistor.

This delay may be fixed in practice to a value which is sufficiently low for not becoming disadvantageous in the case of a motor supply, for example a delay of the order of 1 µs.

Preferably, the first and the second amplifier each supply gate control signals by means of a pair of complementary bipolar transistors whose collectors are interconnected.

This configuration of transistors is highly satisfactory for efficiently ensuring the charging and discharging of the gates of the MOS power transistors.

It will be readily observed that the first MOS power transistor connected to the common mode line has a gate which has a moderate voltage variation, between a zero voltage (earth) up to a gate-source voltage which ensures the conduction of the transistor. As for the second MOS power transistor, however, its gate may be brought to a voltage which varies between wide limits because it has been mounted in follower arrangement. Since the source of the second switching transistor is connected to the common mode line, its gate may be directly connected to the gate of the second MOS power transistor, which imposes particular requirements on the voltage sustaining capability of said second switching transistor.

Nevertheless, in an advantageous embodiment of the invention, of the pair of complementary bipolar output transistors of the second amplifier, that transistor whose emitter is fed with a positive voltage has its collector connected to the collector of the other transistor of the pair via a cascode stage, and the connection point between the collector of this other transistor and the cascode stage forms the inhibiting input of the second amplifier.

This cascode stage is preferably realized with an MOS transistor. Said inhibiting input of the second amplifier renders it well possible to earth the gate of the second MOS power transistor practically in the same manner as if the inhibiting input were connected to the gate itself of this transistor. The advantage of the interposed cascode stage is that the inhibiting input has a less voltage excursion lower than that of the gate of the second MOS power transistor, which implies that in an advantageous embodiment this inhibiting input also forms an output for the signal to be applied to the gate of the second switching transistor. The gate of this second switching transistor thus receives a signal which is derived from the gate voltage of the second MOS power transistor by clipping, which renders it possible to use a second switching transistor of a standard type on whose gate the voltage variation remains limited.

To ensure a switching of the amplifiers by a voltage rather than a current control, the inhibiting input of the first amplifier, is provided close to the input of this amplifier where the current to be derived is low. Thus, according to a preferred embodiment in, the power amplifier stage in which the first amplifier comprises at the input a differential pair of bipolar transistors whose connection point of the united emitters is fed with a constant current from the positive supply line and whose bases are coupled to the respective inputs of said first amplifier, the collector of one of the transistors of the differential input pair forms an inhibiting input for this first amplifier. The collector in question is coupled to the common mode line (earth) via a load which may be an input diode of a current mirror. The collector in question on the one hand passes a low current, at most equal to the constant current which supplies this differential pair, and on the other hand has a low voltage variation so that this electrode forms a particularly advantageous inhibiting input for the first amplifier.

Preferably, the power amplifier stage according to the invention includes a generator of the voltage-doubling type for providing an additional positive supply voltage higher than the supply voltage mentioned earlier, which additional voltage is used for supplying the second amplifier.

The power amplifier stage is thus capable of providing an output voltage whose variation can range practically from the common mode voltage to the normal positive supply voltage. The surplus voltage provided by the additional positive supply then renders possible a suitable polarization of the gate of the second MOS power transistor.

It is important in this case to limit the current level delivered by the additional positive supply. The power amplifier stage according to the invention advantageously comprises in its second amplifier limitation means for the current consumed from the additional positive supply, which means are arranged so as to limit said consumed current to a multiple of the current value supplied by a reference current source, which multiple is established from the ratio of the emitter surfaces of a current mirror, while the current limitation means are completed by two further current mirrors.

The amplifier stage according to the invention is preferably used in association with another identical stage, which assembly is connected so as to form a bridge-type motor supply unit.

BRIEF DESCRIPTION OF THE DRAWING

The following description given with reference to the annexed drawings, by way of example without being limited thereto, will render it clear in what the invention consists and how it may be realised.

DETAILED DESCRIPTION OF THE PREFERRED EMBODIMENTS

Figure 1:
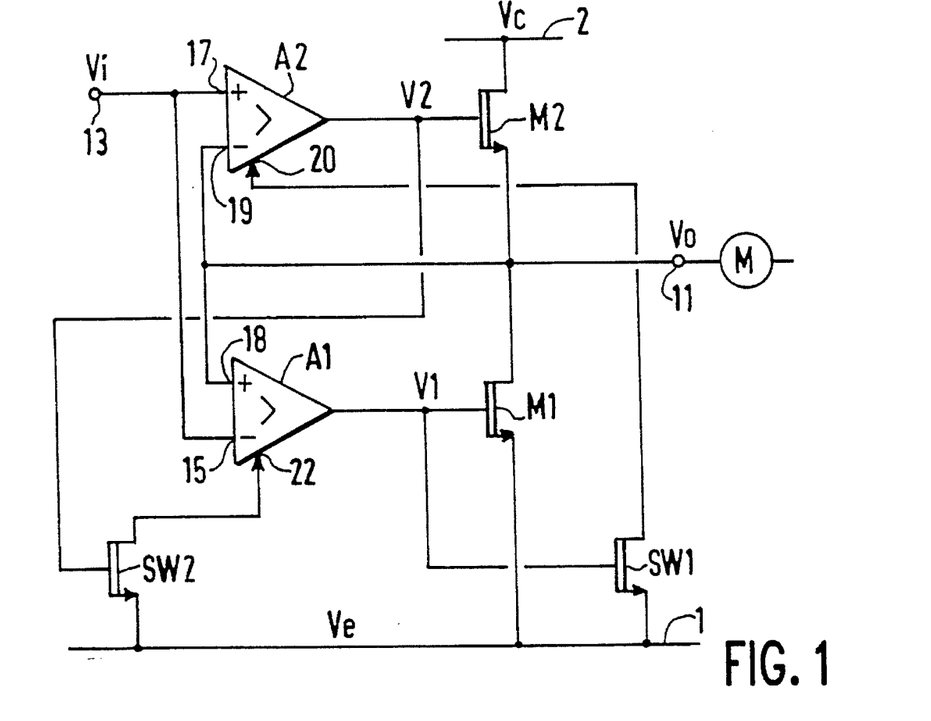
FIG. 1 is a general diagram of an amplifier stage according to the invention.

FIG. 1 shows a power amplifier stage in highly diagrammatic form, which stage is of the voltage follower type and receives an input signal Vi, while delivering an output signal Vo, in particular for the supply of a motor M. This stage comprises a first amplifier A1 which supplies a first control signal V1 to the gate of a first MOS power transistor M1. The amplifier stage also comprises a second amplifier A2 which supplies a control signal V2 to the gate of a second MOS power transistor M2. The transistors M1 and M2 are arranged in series between a common mode line 1 (earth) having a voltage Ve, and a positive supply line 2 having a voltage Vc. The two transistors M1 and M2 are of the same, N-channel type, while the source of transistor M1 is coupled to the common mode line 1, its drain coupled to the source of transistor M2, which connection forms the output of the amplifier stage supplying the output signal Vo at terminal 11, and the drain of transistor M2 is coupled to the positive supply line 2. The input signal Vi is applied to an input terminal 13 coupled to a first input 15 of the first amplifier A1 as well as to a first input 17 of the second amplifier A2. These two amplifiers receive at a second input, at the input 18 of the first amplifier as well as at the input 19 of the second amplifier, respectively, the output signal Vo with which the input signal Vi is compared.

According to the invention, a simultaneous conduction of the two MOS power transistors M1 and M2 is avoided by means of two switching transistors, SW1 and SW2, which are of the MOS field effect type and whose sources are each connected to the common mode line 1.

The first switching transistor SW1 has its gate connected to the gate of transistor M1 and its drain connected to an inhibiting input 20 of the second amplifier A2. The amplifier A2 is so arranged that, when its inhibiting input 20 is brought to the voltage Ve (earth), this amplifier A2 supplies a gate control signal V2 which is equal to the voltage Ve, or very close thereto, i.e. it drives the transistor M2 into a non-conducting state.

A similar mechanism is achieved by means of the second switching transistor SW2 whose gate is coupled to the gate of the transistor M2, or to a voltage which is derived from the voltage of this gate, as it will be seen further below, and whose drain is coupled to an inhibiting input 22 of the amplifier A1.

Similarly, when the inhibiting input 22 is brought to the voltage Ve (earth), the amplifier A1 supplies a control signal V1 which is again substantially equal to the voltage Ve so that the transistor M1 is rendered non-conducting.

Owing to this arrangement, only one of the two MOS power transistors, M1 or M2, can be conducting at any given moment, with its gate control voltage being different from 0 while inhibiting the control voltage at the output of the other amplifier. All risks of short-circuits between the positive supply line 2 and the common mode line 1 are thus avoided, which short-circuits would cause irreparable damage to the power amplifier stage, especially the destruction of either of the output transistors of this stage.

Figure 2:
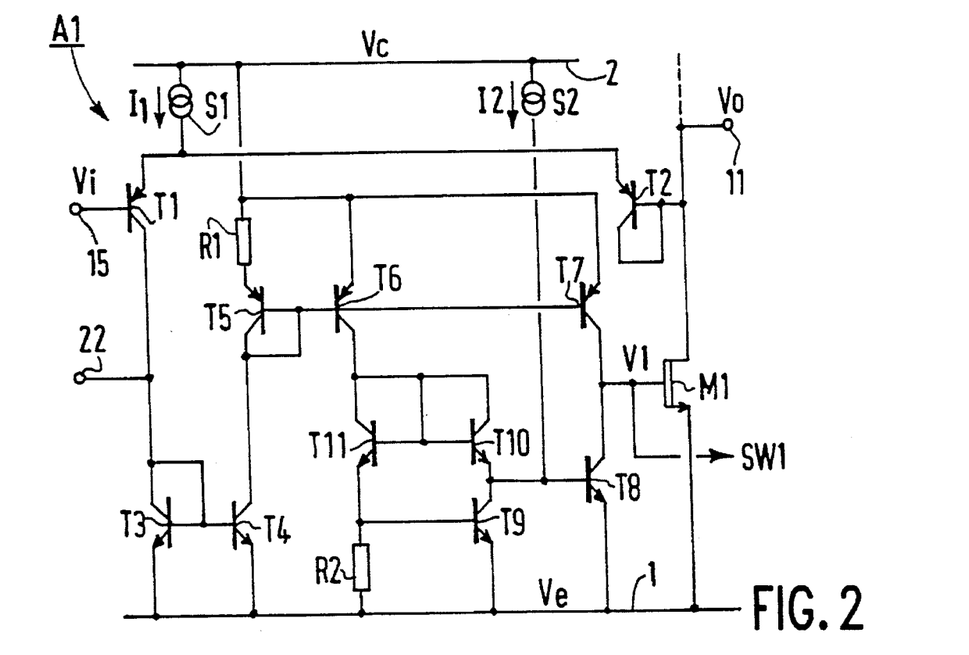
FIG. 2 shows the electrical circuit of a portion of the stage of FIG. 1 in an embodiment of the invention.

FIG. 2 shows the circuit diagram of an embodiment of one of the amplifiers, such as the amplifier A1 of FIG. 1. The first MOS power transistor M1 and the output terminal 11 of the amplifier stage carrying the output voltage Vo are also shown in this Figure.

The input 15 of the amplifier carries the voltage Vi. This input voltage is compared with the output voltage Vo by means of a differential pair of PNP transistors T1, T2 whose united emitters are supplied by a current source S1 which delivers a current I1 from a positive supply voltage Vc. The transistor T2 is connected as a diode, while the transistor T1 has its collector coupled to the common mode line 1 via the input branch of a current mirror T3, T4 with NPN transistors. The input transistor T3 of this current mirror is connected as a diode, while the output transistor T4 provides a current which is identical to that provided by the transistor T1, which current is drawn from a PNP transistor T5 which is connected as a diode. The transistor T5 has its base coupled to the base of two other PNP transistors T6 and T7. The transistor T5 has its emitter coupled to the positive supply line 2 via an emitter resistance R1, whereas the transistors T6 and T7 have emitters directly connected to the supply line 2.

The assembly of the transistors T5, T6, T7 forms a current amplifier, the currents delivered by the transistors T6 and T7 being equal since these two transistors are mounted as a current mirror. The collector of the transistor T7 is connected to the collector of a NPN transistor T8 whose emitter is connected to the common mode line 1. This transistor pair T7, T8 forms the output of the amplifier, supplying a control voltage V1 to the gate of the MOS power transistor M1. The base of the transistor T8 is connected on the one hand to a current source S2 which supplies a current I2. On the other hand, it is connected to the collector of an NPN transistor T9 which forms part of an assembly formed by two NPN transistors T10, T11 arranged as diodes and coupled to the collector of the PNP transistor T6, which assembly in addition comprises a resistor R2 connecting the base of the transistor T9 to the common mode line 1, which base is also connected to the emitter of the transistor T11.

This assembly, and especially the value of the resistor R2, are provided in order that the currents supplied by the transistors T7 and T8 are equal when the voltage difference (Vi−Vo) is close to zero, which represents the equilibrium state of the amplifier.

If the voltage of the input signal Vi is momentarily higher than the output voltage Vo, the current supplied by transistor T1 is lower than its nominal current (in the equilibrium state), and the same holds for the current absorbed by the transistor T4 at the output of the current mirror T3, T4. Under these conditions, the current supplied by the transistors T6 and T7 is lower than the nominal idle value. The transistor T9 is practically blocked, as is the transistor T10. The entire current I2 from the current source S2 thus supplies the base of the transistor T8, which supplies its maximum current.

If, on the other hand, the voltage of the input signal Vi is lower temporarily than the output voltage Vo, the input transistor T1 of the pair T1, T2 supplies a current higher than its nominal current, which is amplified by the assembly formed by the resistor R1, transistors T5, T6, T7, whereupon the transistors T6 and T7 both supply a current which is substantially amplified owing to the voltage drop in the emitter resistance R1. The substantial current supplied by the transistor T6 causes via the transistor T11 arranged as a diode a voltage drop in the resistor R2 which is high enough compared with the emitter/base voltage of the transistor T9, so that this transistor conducts and absorbs the major portion of the current I2 provided by the current source S2. Thus the transistor T8 substantially does not carry a current when the output transistor T7 is conducting.

The advantage of a circuit as described with reference to FIG. 2, realised mainly with bipolar transistors, is that the amplifier is capable of providing at the output a control signal V1 for the gate of the MOS power transistor M1 in the form of a charging or discharging current for the gate capacitance of this transistor, which may have a comparatively high value (a few milliamps) in the case of a transitory imbalance of the amplifier. When this amplifier returns to its equilibrium state, the output voltage Vo very closely approximating the input voltage Vi then, the equal currents supplied by the transistor T7 and absorbed by the transistor T8 at the output of the amplifier are very low and may be reduced to a value below, for example, 50 µA.

As for this amplifier A1, it will be noted that the control voltage V1 applied to the gate of transistor M1 necessitates a comparatively small variation between a zero voltage and a gate-source voltage which is sufficient for rendering the transistor M1 strongly conducting. Under these circumstances, it is particularly simple to use the control voltage V1 present at the gate of transistor M1 also as a gate voltage for the switching transistor SW1 (not shown in FIG. 2), whose simultaneous conduction accompanying the conduction of transistor M1 will cause the blocking of the second amplifier A2, as shown in FIG. 1.

An inhibiting input of the amplifier A1 must be provided such that the amplifier A1 drives the power transistor M1 into non-conduction when this input is connected to earth. Advantageously, such an inhibiting input visible with reference numeral 22 in the Figure is connected to the connection point between the collector of transistor T1 and the collector of transistor T3 of the mirror T3, T4. When this input 22 is earthed, the current supplied by the transistor T1 is derived outside the current mirror T3, T4 so that the transistor T4 no longer passes current, and neither do the transistors T5, T6 and T7. As was seen above, the transistor T9 passes substantially no current, so that all of the current I2 from the current source S2 is introduced as a base current for transistor T8. This current supplies a gate discharging current for the power transistor M1, as long as this gate is charged, while the transistor T8 enters the saturated state when the gate of transistor M1 has been completely discharged.

Figure 3:
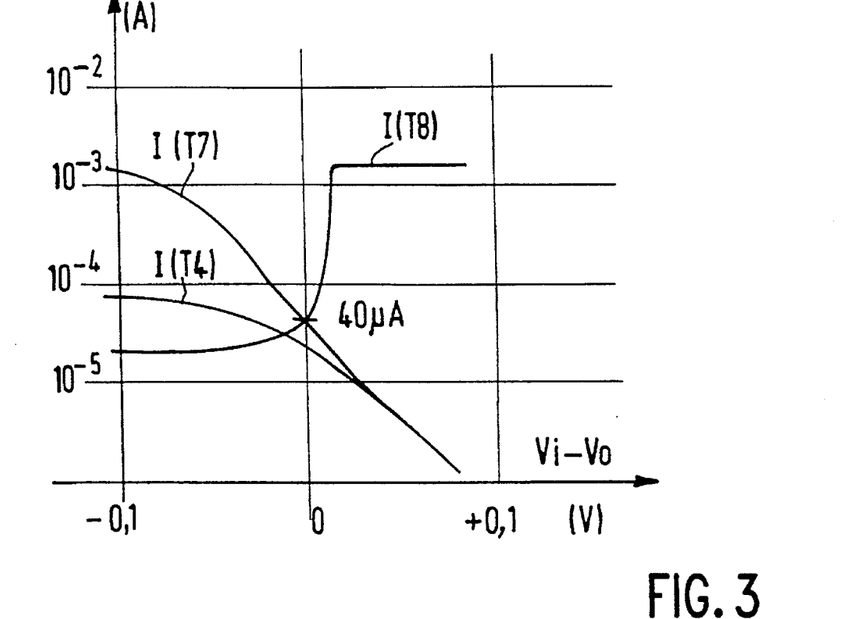
FIG. 3 shows current curves relating to the circuit portion shown in FIG. 2.

FIG. 3 shows the transient shapes of the currents: I(T4), passed by the transistor T4, I(T7) passed by the transistor T7, and I(T8) passed by the transistor T8, as a function of the voltage imbalance between the input voltage Vi and the output voltage Vo. The logarithmic scale used for the currents in the Figure shows that the action on the gate of the MOS power transistor M1 is very strong in the case of an imbalance of the input voltage, whereas in the idle state the amplifier supplies no more than approximately 40 µA at the output by way of the transistors T7 and T8, in a practical example.

Figure 4:
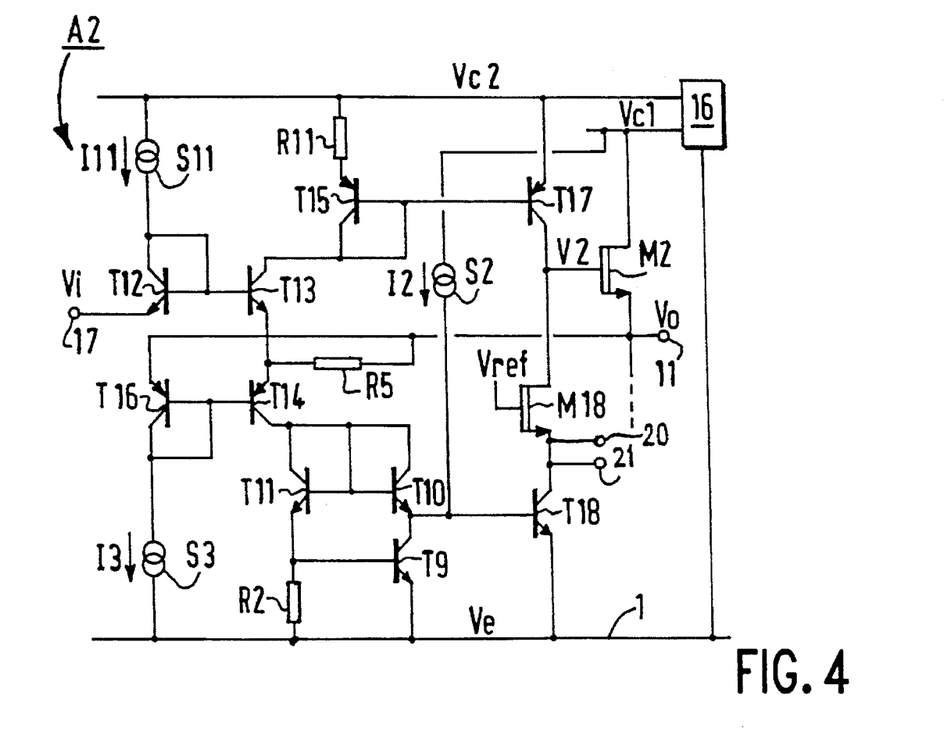
FIG. 4 is the circuit diagram of another portion of the stage of FIG. 1, in a first embodiment.

FIG. 4 is a circuit diagram of an embodiment of the amplifier A2 in FIG. 1. In this FIG. 4, the second MOS power transistor M2 is again shown, to which the amplifier stage shown supplies the gate control signal V2. The amplifier A2 controlling the transistor M2 is constructed mainly on the same principle as the amplifier A1 shown in FIG. 2.

Elements having the same function have been given the same reference numerals as those in the preceding Figures. In FIG. 4, the NPN transistor T18 performs substantially the same function as transistor T8 in FIG. 2 whose base is supplied by a current source S2 supplying a current I2. In the present embodiment, the collector of transistor T18 is coupled to the collector of a PNP transistor T17 via a cascode stage realised by means of an MOS transistor M18 whose gate is polarized with a reference voltage Vref. The control voltage V2 for the gate of transistor M2 is thus derived from the interconnection point of the collector of transistor T17 and the drain of transistor M18. Since the output voltage Vo of the amplifier stage is connected to the source of the power transistor M2, this output voltage Vo can reach the level of the positive supply voltage $V_{c1}$, provided its gate control voltage V2 can rise beyond this positive voltage $V_{c1}$. This is why the amplifier A2 is shown as being positively supplied with a voltage $V_{c2}$, higher than $V_{c1}$, which is produced by a voltage-doubling circuit 16 of a classical type, starting from the voltage $V_{c1}$.

In an embodiment, the voltage $V_{c1}$ is equal to 12 V while the voltage $V_{c2}$ is of the order of 18 V. The assembly formed by transistors T9, T10, T11 and resistor R2, designed to control the base current of transistor T18, performs the same function as the assembly described above with reference to FIG. 2 in relation to the control of the base current of transistor T8. The signal Vi applied to the input terminal 17 of amplifier A2 is compared with the output signal Vo by means of two pairs of transistors. The signals Vi and Vo are brought respectively to the emitters of a first pair of NPN transistors T12, T13, while the joint bases of these transistors T12, T13 are supplied by a current source S11 delivering a current I11. In addition, the transistor T12 is connected as a diode through a connection between base and collector.

A second pair of transistors T14, T16 of the PNP type constitutes a comparator assembly symmetrical with the preceding two transistors, wherein the transistor T16 is connected as a diode and supplied by a current source S3 delivering a current I3 towards the common mode line 1. Finally, the comparator formed by the transistors T12, T13, T14, T16 forms an amplifier for the current passed by the transistors T13, T14 when the input voltage Vi is higher than the output voltage Vo, the currents passed by the transistors T13 and T14 in the means time remaining identical to one another.

When the input voltage Vi is lower than the output voltage Vo, the transistors T13 and T14 are driven into a state close to the blocked state in which these transistors supply a current which is very much lower than the idle current of the stage in the equilibrium state as obtained when Vo is equal to Vi. The transistor T14 plays the same part as the transistor T6 in the diagram of FIG. 2. When the current of T14 rises above the nominal idle current, the transistor T18 is driven into non-conduction through absorption of the current from current source S2 by the transistor T9. In the same manner, the transistor T13 passes a current which is amplified by the assembly of a transistor T15 mounted as a diode and having an emitter resistance R11 coupled in parallel with the transistor T17, which in conjunction with the transistor T18 forms the pair of output transistors. When the current passed by the transistor T13 rises, obviously, the current passed by the transistor T17 rises even more quickly. The transient current supplied by the transistors T17 and T18 can be comparatively strong, as in the preceding assembly, i.e. of the order of a few milliamps, whereas the idle current of these two transistors is controlled, for example, at 40 µA when the amplifier is in equilibrium (input voltage equal to output voltage).

As is shown in FIG. 4, a resistance R5 is arranged in parallel between the emitters of the transistors T14 and T16. This resistance R5 is optional, it has a high value of, for example, 50 KOhms, and is intended for avoiding that the connection between the emitter of transistor T13 and the emitter of transistor T14 becomes floating in the case of a strong imbalance of the amplifier.

The amplification characteristics of the amplifier A2 are substantially identical to those of the amplifier A1 described with reference to FIG. 2.

The control voltage V2 for the gate of the MOS power transistor M2 varies between wide limits, here from a zero voltage up to practically the voltage $V_{c2}$, allowing for the saturation voltage of transistor T17. The gate connection of the power transistor M2 may thus form an output for controlling the second switching transistor SW2 (not shown in FIG. 4) as well as an input terminal for the inhibiting command of this amplifier A2 since the transistor M2 will be blocked by its gate being connected to earth. In the assembly shown in FIG. 4, however, the connection between the source of transistor M18 and the collector of transistor T18 forms a preferred output, indicated as a terminal 21, for the control of the second switching transistor SW2. In fact, the voltage obtained at terminal 21 is derived from the gate voltage of transistor M2, realised apart from clipping by the cascode transistor M18. It fixes a maximum voltage for the output voltage of terminal 21 equal to the reference voltage Vref minus the threshold voltage of this transistor. Since the voltage at terminal 21 shows a smaller variation than the gate voltage of transistor M2, this terminal 21 thus forms an advantageous control for the second switching transistor SW2 which may now be of a normal type which does not necessitate a voltage sustaining capability as high as the voltage which may be present at the gate of transistor M2.

The collector of transistor T18 may also form an input terminal 20 for the inhibiting command of amplifier A2. In fact, when terminal 20 is connected to earth, the cascode transistor M18 is necessarily conducting so that the current supplied by the transistor T17 is by-passed towards earth. The transistor M2 is blocked thereby.

When the amplifier A2 is supplied with a positive supply voltage $V_{c2}$ higher than the normal supply voltage $V_{c1}$ of the circuit, as is shown in FIG. 4, it is advantageous to fix a limit for the current passed by the transistor T17 as well as for the currents supplied by the transistors T13 and T15.

Figure 5:
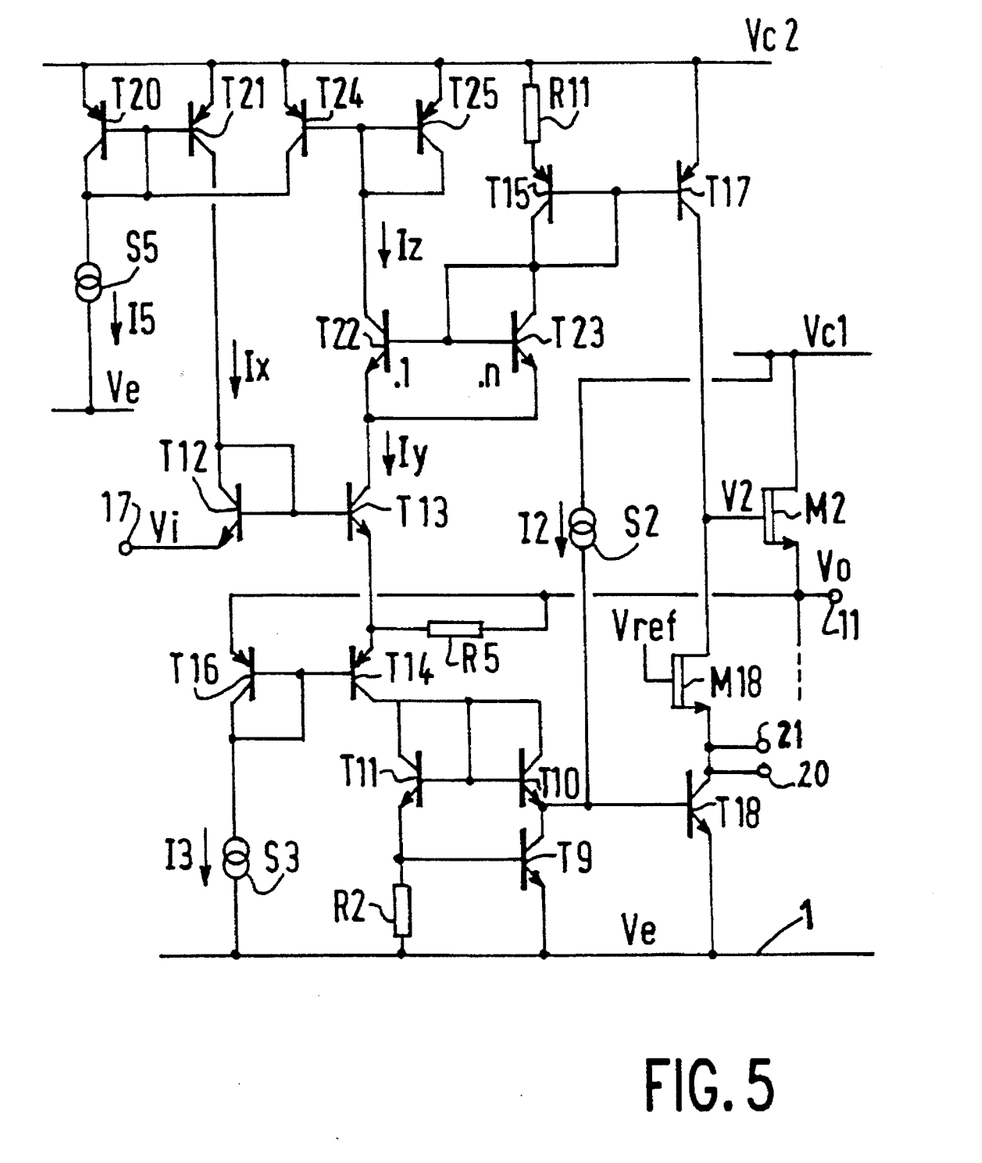
FIG. 5 is the circuit diagram of this same portion, but in another embodiment which includes current limitation means for the positive supply line, and FIGS. 6 and 7 give current curves relating to the circuit of FIG. 5.

For this purpose, FIG. 5 shows a second embodiment of the amplifier A2 which comprises a modification which renders such a current limitation possible. According to this embodiment, the portion relating to the control of transistor T18 remains identical to that shown in FIG. 4, while the circuit modification concerns the control portion for transistor T17. The means rendering possible a limitation of the current in transistors T17 and T15 are substantially formed by a first pair of PNP transistors T20, T21 which are mounted as a current mirror, a second pair of PNP transistors T24, T25 which are mounted as a current mirror, and a third pair of NPN transistors T22, T23 which are mounted as a current mirror, with a divider ratio from n to 1 between its input and its output.

To supply the pair of transistors T12, T13 with current, a reference current source S5, set for the common mode voltage Ve, supplies a reference current I5 in the current mirror T20, T21. The collector current of transistor T13 is variable and depends on the degree of imbalance between the input voltage Vi and the output voltage Vo. This current is written Iy in the Figure. A known fraction, written Iz, of this current Iy, which follows from the surface area ratio between the transistors 722, 723, is absorbed at the input of the current mirror 724, 725. The same current Iz is finally supplied to the current source S5. The current written Ix supplied by the current mirror T20, T21, finally, is equal to the difference between the current I5 and the current Iz. The other part of current Iy passed by the transistor T13, which part is equal to n.Iz owing to the dimensional ratio in the current mirror T22, T23, is applied to the input of the amplifier assembly T15, T17, which amplifier assembly has already been discussed with reference to FIG. 4.

The current n.Iz taken up at the input of the assembly T15, T17 may be readily evaluated:

$$Iz=Iy/(n+1) \text{ and } n.Iz=n.Iy/(n+1) \qquad (1)$$

owing to the division of the current Iy in the current mirror T22, T23.

However, Iz is subtracted from I5 at the input of current mirror T20, T21, so that:

$$Ix=I5-Iz \qquad (2)$$

When the amplifier is in total unbalance, the entire current Ix is introduced into the base of transistor T13, so that then:

$$Iy=\beta Ix \qquad (3)$$

with $\beta$= the current gain of an NPN transistor.

By combining the equations (1) and (3), it follows that a limit value of Iz is:

$$Iz=\beta.Ix/(n+1)=(\beta I5-\beta Iz)/(n+1)$$

$$Iz=I5 \cdot \frac{\beta}{\beta+n+1}$$

and the current nIz absorbed by T23 in T15 is at most:

$$nIz=I5 \cdot \frac{n\beta}{\beta+n+1}$$

When the gain $\beta$ is great compared with n, the current n.Iz tends towards:

$$nIz \approx n.I5$$

Given a ratio n=10, for example, a gain $\beta$ of 100 and a reference current I5 of 10 µA, it follows that the limitation current nIz taken up by the transistor T23 is of the order of 90 to 100 µA.

Taking into account the value chosen for the emitter resistance R11, it is possible to know exactly the maximum current which can be passed by the transistor T17 in case of a very strong imbalance of the amplifier A2.

When the gate of transistor M2 is fully charged by the transistor T17, it will enter the saturated state and the collector can no longer supply current. The current consumed with the amplifier held in imbalance would then be reduced to the current supplied by the transistor T23, i.e. a current approximately 20 times smaller than the maximum charging current of transistor T17 when it is not saturated that is, in a transition state.

It is apparent that the current limiter circuit as described with reference to FIG. 5 is particularly effective. It allows to fix a limit for the currents consumed at the additional positive supply voltage $V_{c2}$, which limit is then independent of the gain of the transistors and of the variation in gain with temperature, which was not the case with the circuit shown in FIG. 4.

Figure 6:
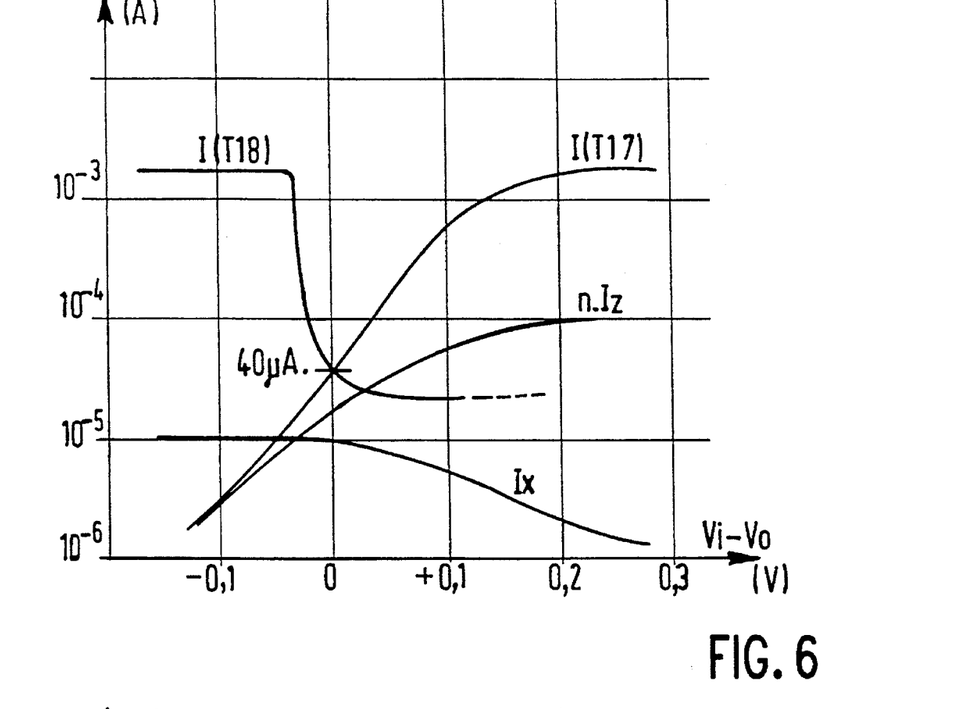

FIG. 6 shows the graphs of the currents Ix, passed by transistor T12, n.Iz passed by transistor T23, I(T17) passed by transistor T17, and I(T18) passed by transistor T18, as a function of a transient imbalance in voltage (Vi–Vo). A logarithmic current scale is used. The curves in FIG. 6 show the high current amplification rate when the amplifier is in a transitory state of imbalance.

Figure 7:
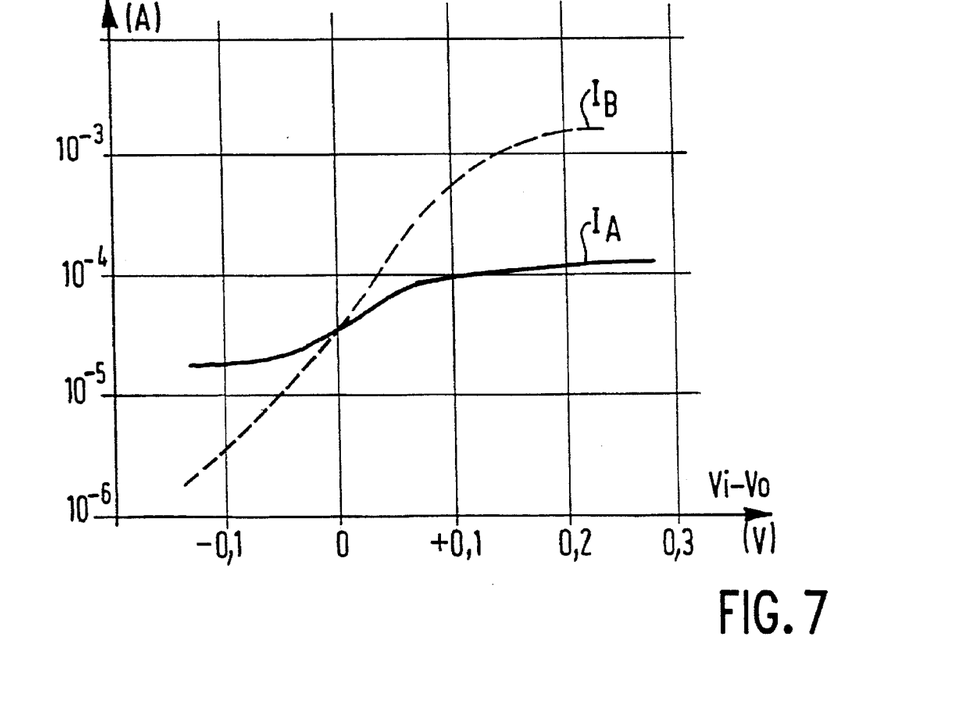

FIG. 7 shows with curve $I_A$ the total current drawn from the additional positive supply $V_{c2}$ as a function of the voltage difference (Vi–Vo) in permanent operation, and especially when the transistor T17 is saturated. For comparison, broken-line curve $I_B$ is identical to curve I(T17) in FIG. 6. It is clearly visible that the current limiter described with reference to FIG. 5 is particularly effective in the case of a static imbalance of the amplifier, although it also renders possible a strong charging current in transient operation.

It is possible to apply minor modifications compared with the examples described above in the realisation of the power amplifier stage without departing from the scope of the invention as claimed hereinafter.

I claim:

1. A power amplifier stage of the voltage follower type which receives an input voltage signal (Vi) and supplies an output signal (Vo), said stage comprising at the output a first MOS power transistor having a source coupled to a common mode line in series with a second MOS power transistor having a drain coupled to a positive supply line, said first and second power transistors being of the same conductivity type and having a common junction point supplying said output signal of the stage; a first amplifier supplying a first control signal to the gate of the first MOS power transistor, a second amplifier supplying a second control signal to the gate of the second MOS power transistor, said first and second amplifier each receiving the input signal at a respective first input and the output signal at a respective second input, wherein to exclude a simultaneous conduction of the two MOS power transistors each of the amplifiers is provided with an inhibiting input and arranged so as to supply a gate control signal equal to the common mode voltage when said inhibiting input is brought to the same common mode voltage, and a first switching transistor of the MOS field effect type having its gate coupled to the gate of the first MOS power transistor, its drain connected to the inhibiting input of the second amplifier and its source coupled to a common mode line, and a second switching transistor of the MOS field effect type having its source coupled to a common mode line, its drain connected to the inhibiting input of the first amplifier and a gate that receives a signal derived from the gate voltage of the second MOS power transistor.

2. The power amplifier stage as claimed in claim 1, wherein the first amplifier includes a first and second bipolar transistor whose collectors are interconnected, and the second amplifier includes a first and second bipolar transistor whose collectors are selectively interconnected.

3. The power amplifier stage as claimed in claim 2, wherein the first transistor of said second amplifier includes an emitter fed with a positive voltage and a collector selectively connected to the collector of the second transistor of the second amplifier via a cascode stage, the connection point between the collector of the second transistor of the second amplifier and the-cascode stage forms the inhibiting input of the second amplifier.

4. The power amplifier stage as claimed in claim 3, wherein the inhibiting input of the second amplifier also forms an output for the signal applied to the gate of the second switching transistor.

5. The power amplifier stage as claimed in claim 1, in which the first amplifier comprises at the input a differential pair of bipolar transistors whose connection point of the united emitters is fed with a constant current from the positive supply line and whose bases are coupled to the respective inputs of said first amplifier, the collector of one of the transistors of said differential pair at the input forms the inhibiting input for the first amplifier.

6. A power amplifier stage of the voltage follower type which receives an input voltage signal and supplies an output signal, said stage comprising at the output a first MOS power transistor having a source coupled to a common mode line in series with a second MOS power transistor having a drain coupled to a positive supply line, said first and second power transistors being of the same conductivity type and having a common junction point supplying said output signal of the stage; a first amplifier supplying a first control signal to the gate of the first MOS power transistor, a second amplifier supplying a second control signal to the gate of the second MOS power transistor, said first and second amplifier each receiving the input signal at a respective first input and the output signal at a respective second input, wherein to exclude a simultaneous conduction of the two MOS power transistors, each of the amplifiers is provided with an inhibiting input and arranged so as to supply a gate control signal equal to the common mode voltage when said inhibiting input is brought to the same common mode voltage, and a first switching transistor of the MOS field effect type having its gate coupled to the gate of the first MOS power transistor, its drain connected to the inhibiting input of the second amplifier and its source coupled to a common mode line, and a second switching transistor of the MOS field effect type having its source coupled to a common mode line, its drain connected to the inhibiting input of the first amplifier and a gate that receives a signal derived from the gate voltage of the second MOS power transistor; and including a generator of the voltage-doubling type for providing an additional positive supply voltage higher than the first mentioned supply voltage, said additional voltage used for supplying the second amplifier.

7. The power amplifier stage as claimed in claim 6, wherein the second amplifier comprises limitation means for the current consumed from the additional positive supply, said limitation means limiting said consumed current to a multiple of the current value supplied by a reference current source, which multiple is established from the ratio of the emitter surfaces of a current mirror, while said current limitation means are completed by two further current mirrors.

* * * * *